United States Patent [19]

Canestrari et al.

[11] Patent Number: 5,246,539
[45] Date of Patent: Sep. 21, 1993

[54] PROCESS FOR PRODUCING METROLOGICAL STRUCTURES PARTICULARLY USEFUL FOR ANALYZING THE ACCURACY OF INSTRUMENTS FOR MEASURING ALIGNMENT ON PROCESSED SUBSTRATES

[75] Inventors: Paolo Canestrari, Merate; Carlo Lietti, Busto Arsizio; Giovanni Rivera, Castiglione Delle Stiviere, all of Italy

[73] Assignee: SGS-Thomson Microelectronics S.r.l., Agrate Brianza, Italy

[21] Appl. No.: 938,826

[22] Filed: Sep. 1, 1992

[30] Foreign Application Priority Data

Sep. 4, 1991 [IT] Italy ............... MI91 A 002345

[51] Int. Cl.$^5$ ............... H01L 21/306; B44C 1/22; C03C 15/00; C23F 1/00
[52] U.S. Cl. ............... 156/659.1; 156/626; 156/651; 156/657; 156/661.1; 156/662; 156/345; 437/228
[58] Field of Search ............... 156/626, 651, 652, 653, 156/657, 659.1, 661.1, 662, 345, 656; 437/8, 225, 228, 233, 235, 238, 241, 245, 229; 430/313, 317, 318; 73/432.1, 865.9

[56] References Cited

U.S. PATENT DOCUMENTS

| | | | |
|---|---|---|---|
| 4,650,744 | 3/1987 | Amano | 156/626 X |
| 5,002,902 | 3/1991 | Watanabe | 437/235 |
| 5,017,512 | 5/1991 | Takagi | 437/227 |
| 5,100,508 | 3/1992 | Yoshida et al. | 156/659.1 |
| 5,114,531 | 5/1992 | Fukushima et al. | 156/659.1 |

FOREIGN PATENT DOCUMENTS

| | | |
|---|---|---|
| 0126621 | 11/1984 | European Pat. Off. |
| 0377101 | 7/1990 | European Pat. Off. |
| 0411797 | 2/1991 | European Pat. Off. |

*Primary Examiner*—William A. Powell
*Attorney, Agent, or Firm*—Wolf, Greenfield & Sacks

[57] ABSTRACT

Process for producing metrological structures particularly useful for analyzing the accuracy of instruments for measuring alignment on processed substrates. The process produces metrological structures which have measurement profiles defined on substrate regions and on industrially-processed regions on a single wafer. The measurement profiles define statistical distributions which can be detected by measurement machines in order to analyze the measurement accuracy of the machines themselves.

23 Claims, 5 Drawing Sheets

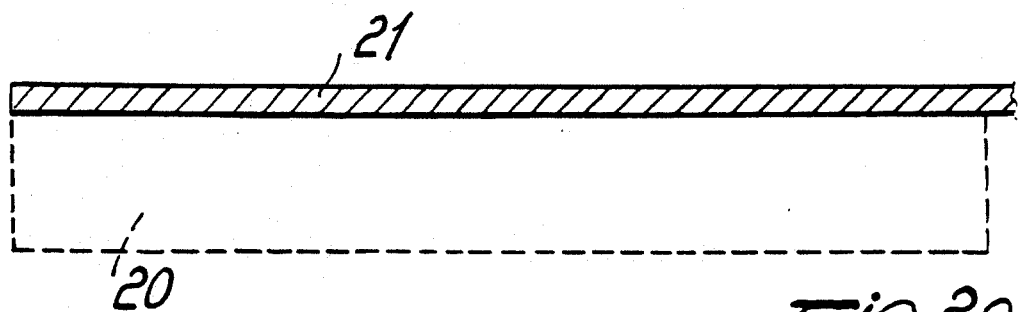
Fig. 2a
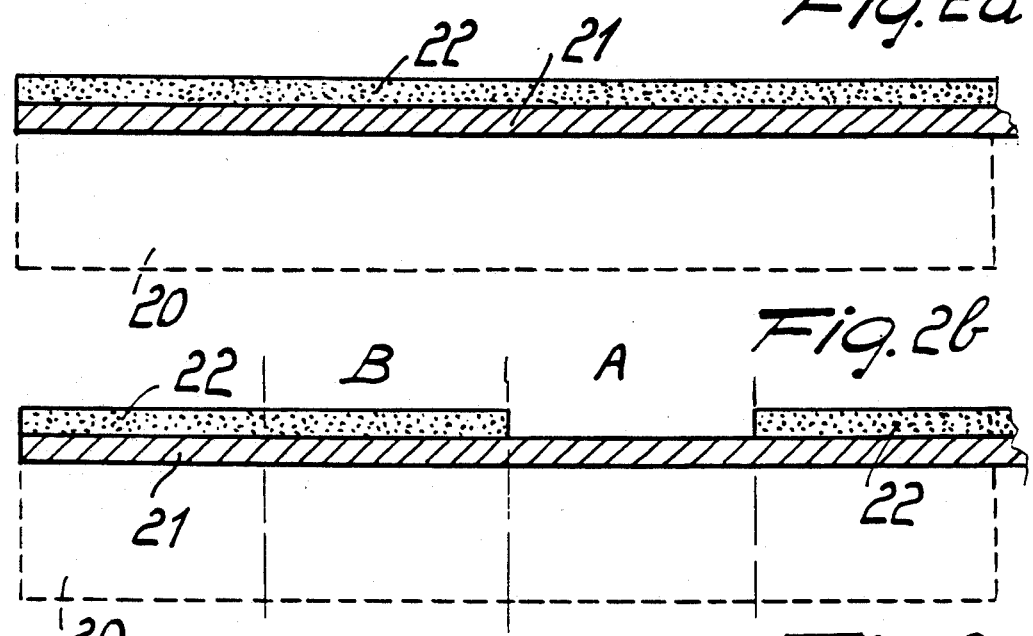
Fig. 2b
Fig. 2c
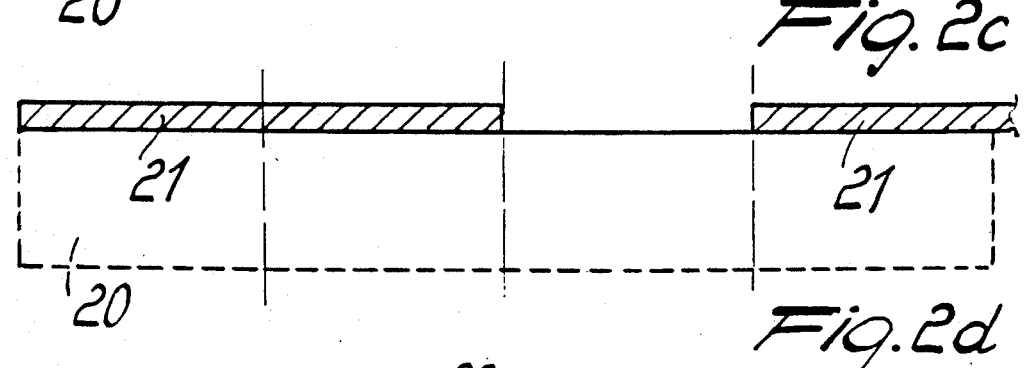
Fig. 2d
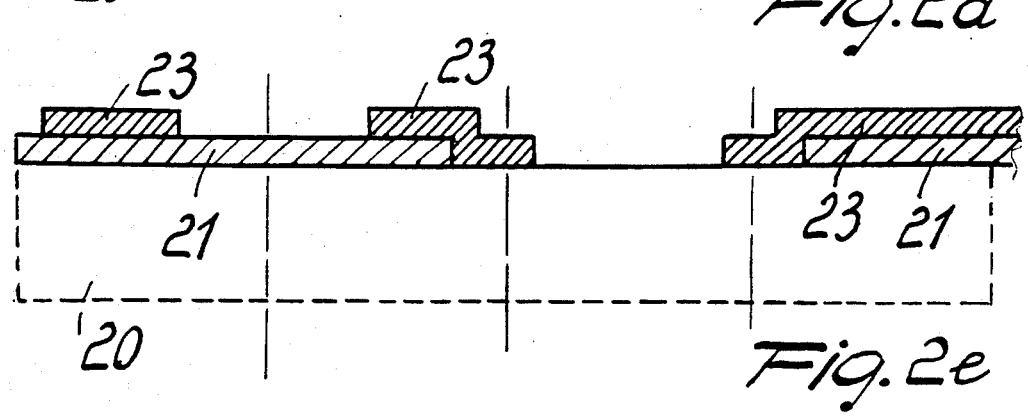
Fig. 2e

PROCESS FOR PRODUCING METROLOGICAL STRUCTURES PARTICULARLY USEFUL FOR ANALYZING THE ACCURACY OF INSTRUMENTS FOR MEASURING ALIGNMENT ON PROCESSED SUBSTRATES

BACKGROUND OF THE INVENTION

The present invention relates to a process for producing metrological structures particularly useful for analyzing the accuracy of instruments for measuring alignment on processed substrates.

Owing to the ever-increasing complexity in producing integrated circuits in general, which complexity leads to an ever-larger number of devices being produced on the same integrated circuit, a problem which is increasingly encountered by specialists is the alignment among the layers of the device, due to the problems related to the defectiveness or non-defectiveness of the integrated circuit itself.

Commercially available alignment measurement instruments are particularly sensitive to the conditions and physical structure of the markings used, since this fact negatively affects the accuracy and precision of the measurement performed.

In fact, whereas markings defined on a silicon substrate are better defined and sharp, ensuring good measurement accuracy, markings defined in the normal production process on industrially-processed substrates are not as sharp and well-defined, and are thus more difficult to measure.

The markings, or rather profiles, which are defined on a substrate in production are in fact not very distinct and furthermore may have been deteriorated by the various steps of the production process itself.

To the above mentioned problems one must furthermore add that currently there are no standardized absolute metrological references for calibrating the measurement instruments themselves.

Currently, in order to calibrate the measurement instruments used in measuring the alignment of integrated devices, the pitches of known structures on substrates or on appropriate quartz grids, on which chrome reference patterns are defined, are measured.

Unfortunately, the described methods are flawed in that they do not effectively represent the real situations which can occur in the real production process, and therefore they lead to a measurement accuracy which seldom achieves the required sensitivity.

SUMMARY OF THE INVENTION

The aim of the present invention is to eliminate or substantially reduce the problems described above by providing a process for producing metrological structures particularly useful for analyzing the accuracy of instruments for measuring alignment on processed substrates, which process provides metrological structures which can simultaneously verify the measurement accuracy of alignment measuring machines both on layers defined directly on the substrate and on layers produced with an industrial production process.

Within the scope of the above aim, an object of the present invention is to provide a process which allows for checking, within the production process, the state of the substrate at a given instant of the process and simultaneously allows the recycling and reprocessing, if any, of said substrate.

Another object of the present invention is to provide a process which is relatively easy to perform and at competitive costs.

This aim, the objects mentioned and others, which will become apparent hereinafter, are achieved by a process for producing metrological structures particularly useful for analyzing the accuracy of instruments for measuring alignment on processed substrates according to the

BRIEF DESCRIPTION OF THE DRAWINGS

Further characteristics and advantages of the invention will become apparent from the description of a preferred but not exclusive embodiment of a process for producing metrological structures particularly useful for analyzing the accuracy of instruments for measuring alignment on processed substrates according to the invention, illustrated only by way of non-limitative example in the accompanying drawings, wherein.

DESCRIPTION OF THE PREFERRED EMBODIMENTS

Hereinafter, the term "to mask" or "masking" is used to designate the known photolithographic process by means of which the radiation-sensitive material is made soluble or insoluble by exposure to a source of radiation which is controlled and filtered by a mask which bears the layout of the individual layer, and the term "developing" designates the removal of the soluble part of the radiation-sensitive material. In most practical cases, the radiation-sensitive material is constituted by photosensitive resin, technically termed "photoresist" (the term used hereinafter). The radiation source is usually a source of electromagnetic radiation, usually in the visible-light range or in the ultraviolet range. The term "etching" designates the incision, by chemical or chemical-physical means, for example in plasma, of the layers of the metrological structure, and the term "doping" or "to dope" designates the insertion, either by gaseous diffusion or by high-energy implanting, of impurities within at least one layer.

Figure 1A:
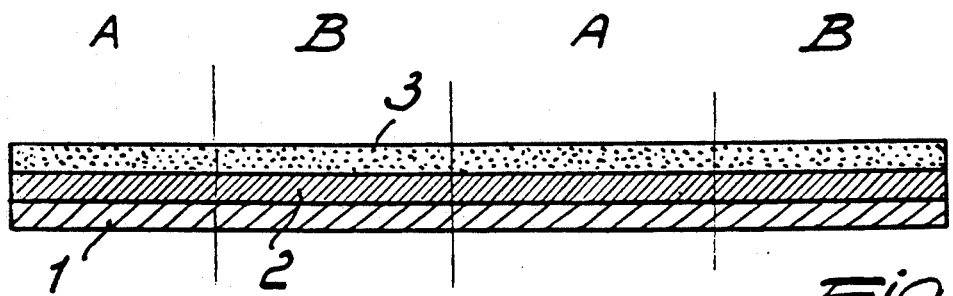
FIGS. 1a to 1k are transverse sectional views of a metrological structure, illustrating sequential steps of a first embodiment of the invention.
Figure 1B:
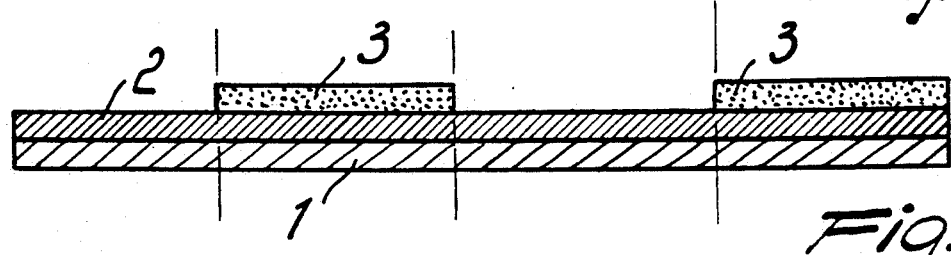
Figure 1C:
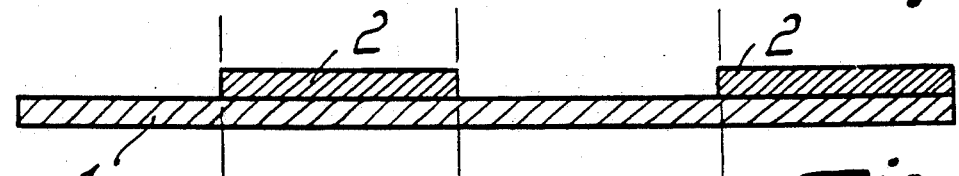
Figure 1D:
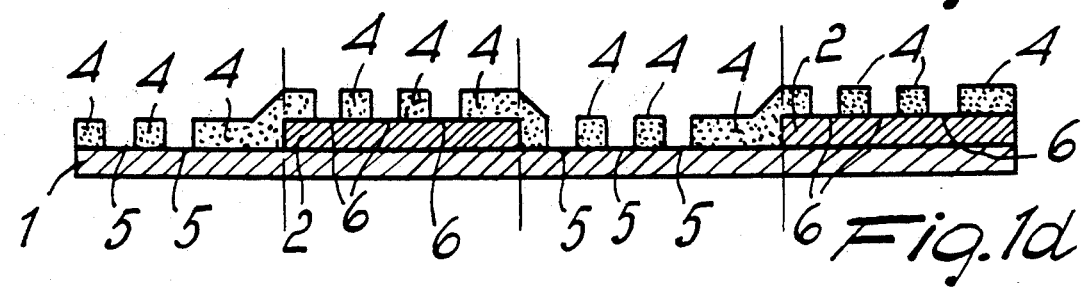
Figure 1E:
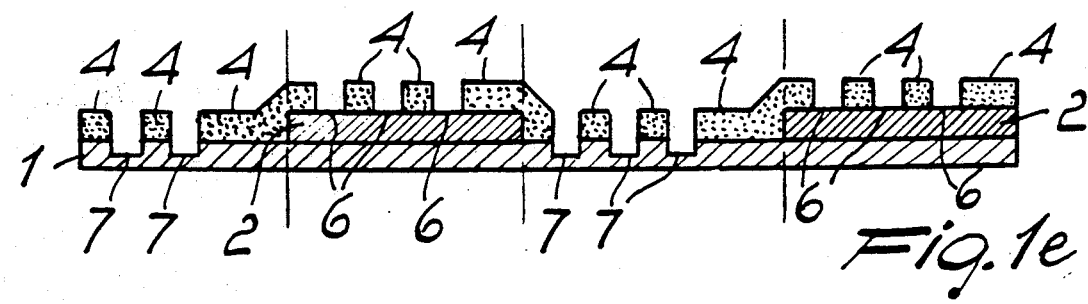
Figure 1F:
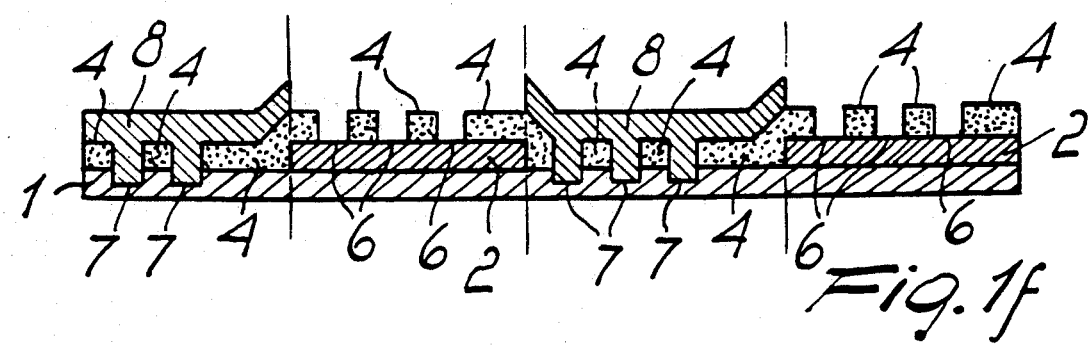
Figure 1G:
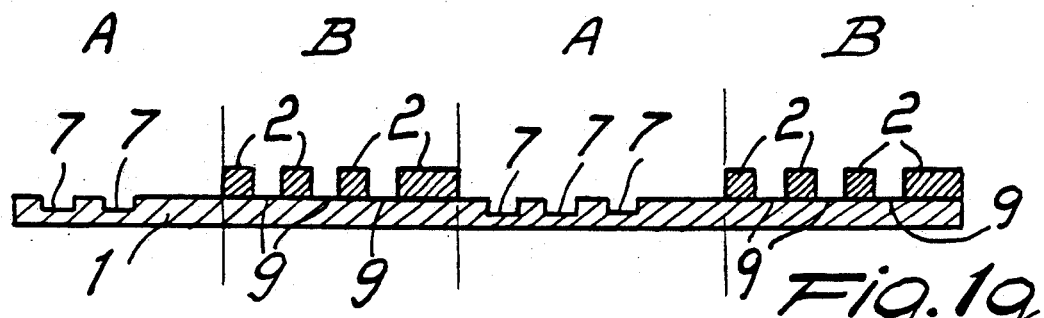
Figure 1H:
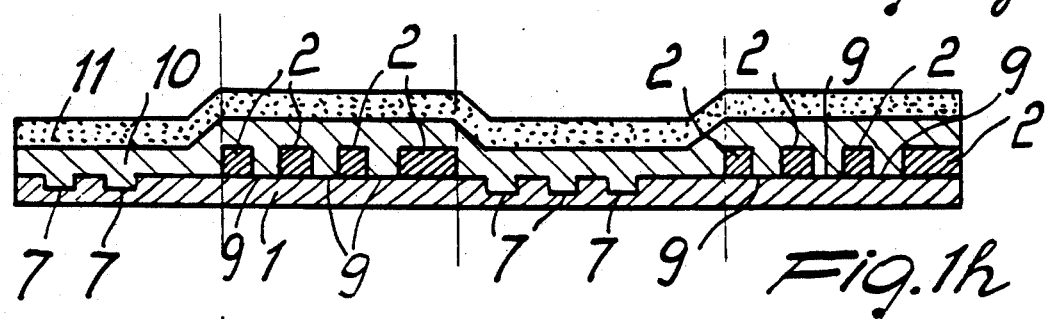
Figure 1I:
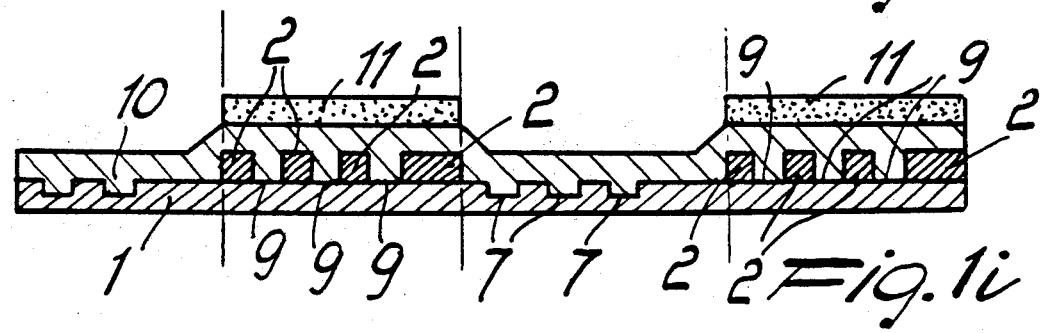
Figure 1J:
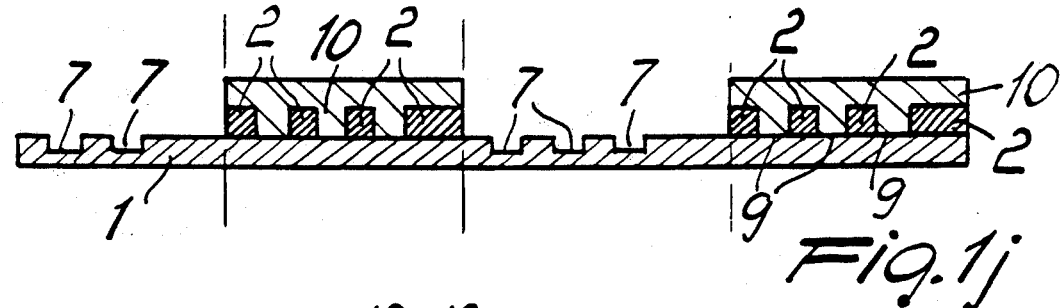
Figure 1K:
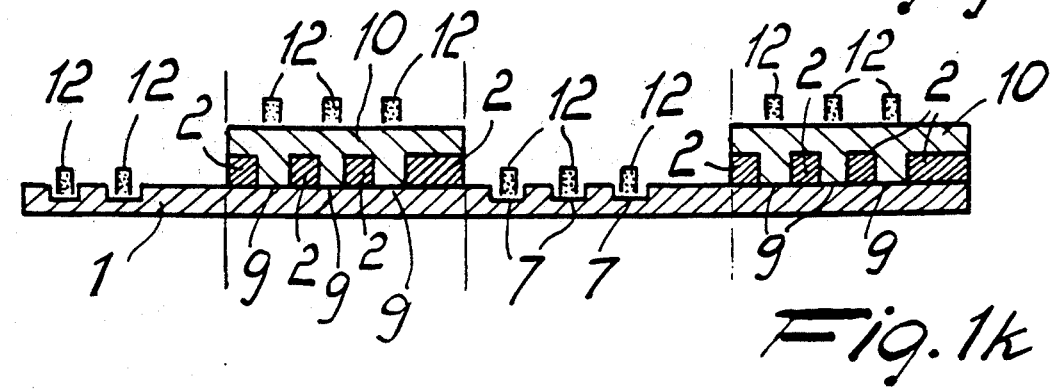

With reference to figures 1a to 1k, a process for producing metrological structures particularly useful for analyzing the accuracy of instruments for measuring alignment on processed substrates according to the invention comprises the following steps, performed sequentially on a substrate 1, for example made of silicon:

an initial step, FIG. 1a, during which a first layer 2 of a first material is deposited on the substrate 1;

an area definition step, FIGS. 1a and 1b, during which a layer 3 of photoresist is deposited on the first layer 1 and is masked and developed in order to select regions A of the substrate 1 and regions B of the first layer 2;

a first etching step, FIG. 1c, during which the regions A of the first layer 2 which were uncovered during the area definition step are etched. The remaining part of the photoresist layer 3 is then removed, defining on the substrate 1 a plurality of regions A and B which alternate with one another in a preset manner, that it to say, for example, in a checker-like pattern, or in bands or in mutually concentric rings and the like;

a first deposition step, FIG. 1d, during which the regions A and B are simultaneously covered with a deposition of a photoresist layer 4 which is subsequently masked and developed, uncovering insulated regions 5 of the substrate 1 and insulated regions 6 of the first layer 2;

a second etching step, FIG. 1e, during which the insulated regions 5 of the substrate 1 are etched, defining wells 7 and also partially etching the insulated regions 6 of the first layer 2;

a second deposition step, FIG. 1f, during which the regions A and B are simultaneously covered with a deposition of another photoresist layer 8 which is masked and developed in order to uncover the insulated regions 6 of the first layer 2;

a third etching step, FIG. 1g, during which the insulated regions 6 of the first layer 2 are etched, creating wells 9, and the remainder of the photoresist layers 4 and 8 is subsequently removed;

a third deposition step, FIG. 1h, during which a second layer 10 of a second material, such as for example silicon oxide, is deposited on the regions A and B;

a fourth deposition step, FIGS. 1h and 1i, during which a photoresist layer 11 is deposited on the second layer 10 and is then masked and developed, uncovering regions A of the second layer 10 at the regions A of the substrate 1;

a fourth etching step, FIG. 1j, during which the regions A of the second layer 10 are etched, uncovering the regions A of the substrate 1, and the remainder of the photoresist layer 11 is removed;

a final step, FIG. 1k, during which the regions A and B of the substrate 1 and of the second layer 10 are covered with the deposition of a photoresist layer 12 which is masked and developed, obtaining photoresist insulated regions, designated by the same reference numeral 12, defined at the wells 7 of the substrate 1 and at the wells 9 of the first layer 2.

In the above described steps of the process of the invention, the first material is constituted by polysilicon, or by a contact dielectric, or by a first metallization, or by vias, whereas the second material is constituted by a layer of contacts, or by a first metallization, or by vias, or by a second metallization, or vice versa, depending on the various applications to which measurement machines must be assigned, and therefore depending on whether the sensitivity of the machines or of the measurement instruments must be assessed.

The process as described above can be continued further by etching the silicon, that is to say the substrate 1, and the oxide, that is to say the second layer 10, in order to obtain metrological references for characterizing instruments for measurements on etched layers.

Figure 2F:
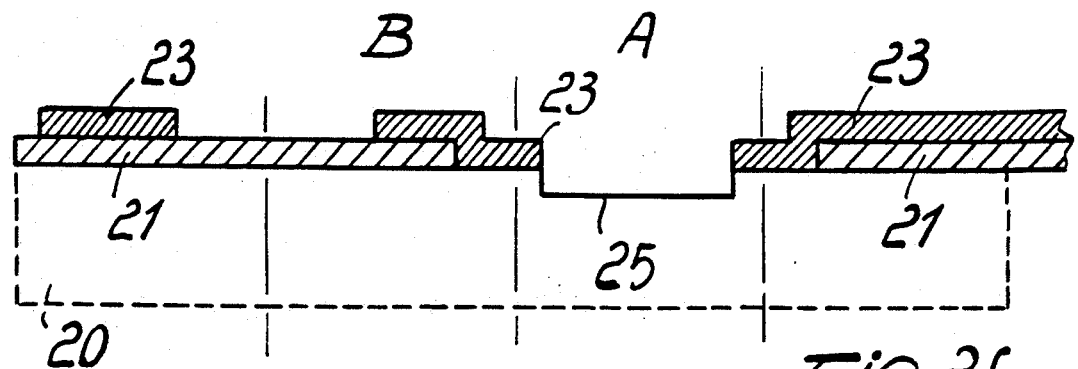
FIGS. 2a to 2o are transverse sectional views of a metrological structure, illustrating sequential steps of a second embodiment of the invention.
Figure 2G:
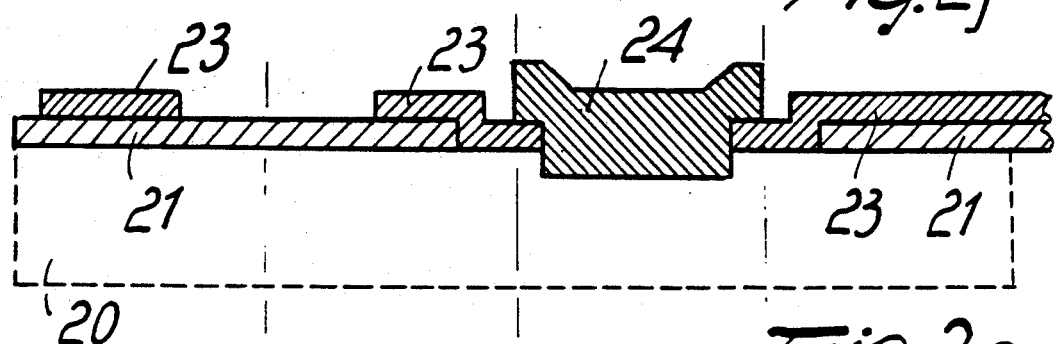
Figure 2H:
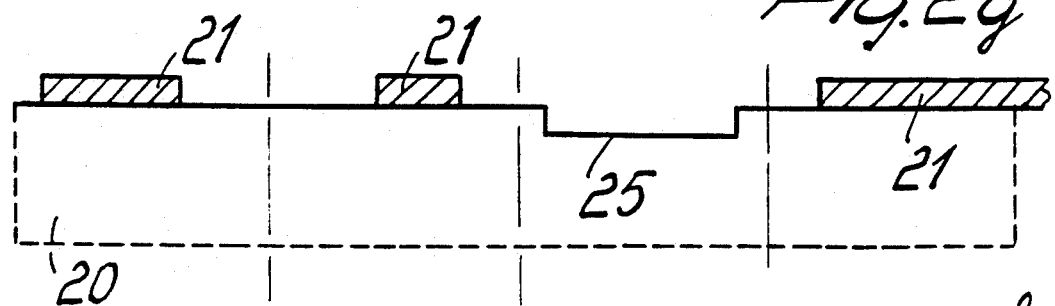
Figure 2I:
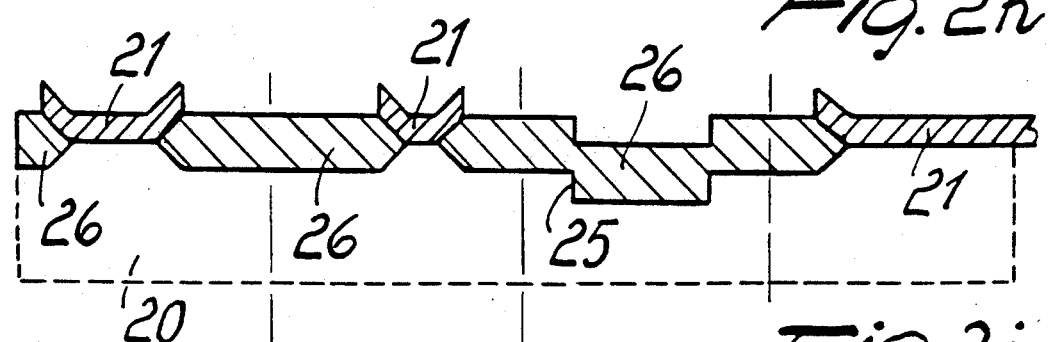
Figure 2J:
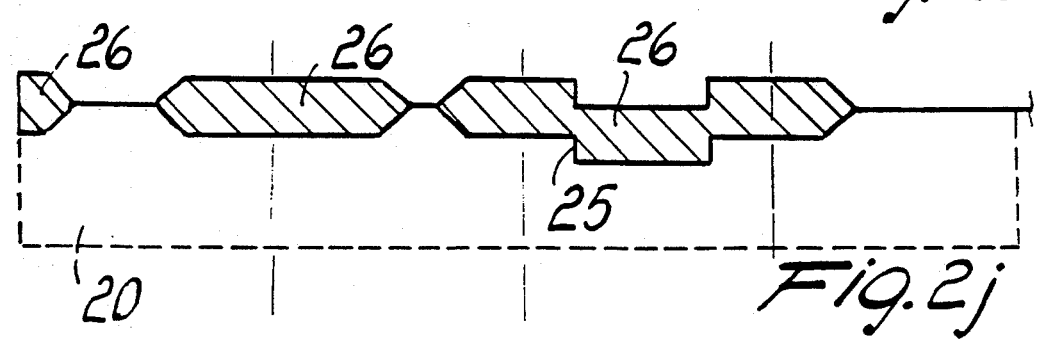
Figure 2K:
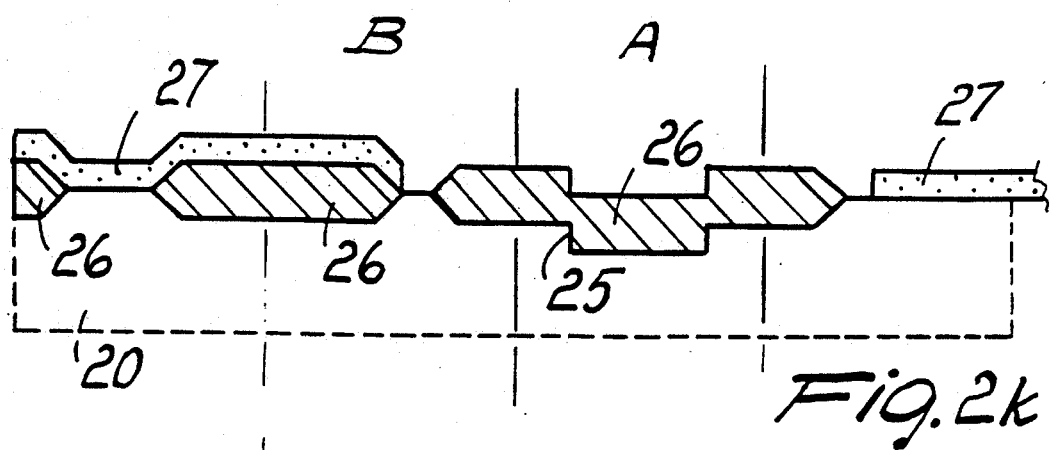
Figure 2L:
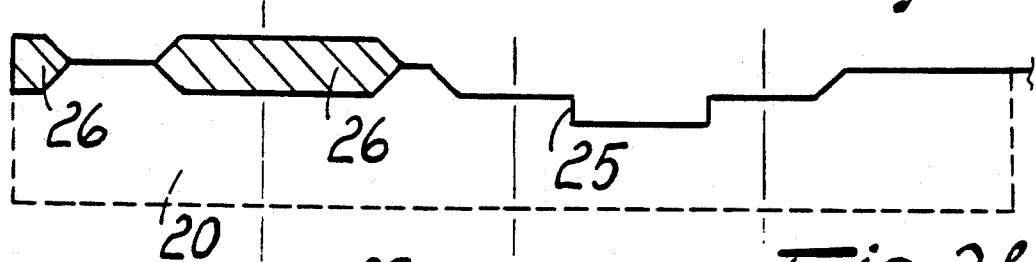
Figure 2M:
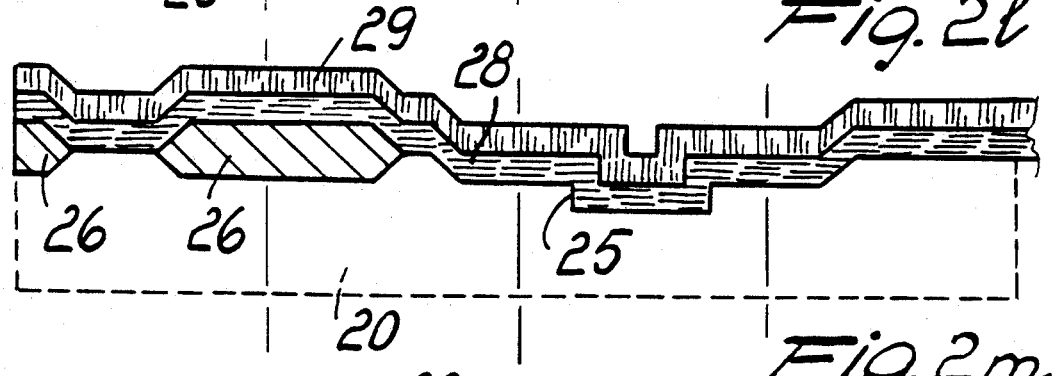
Figure 2N:
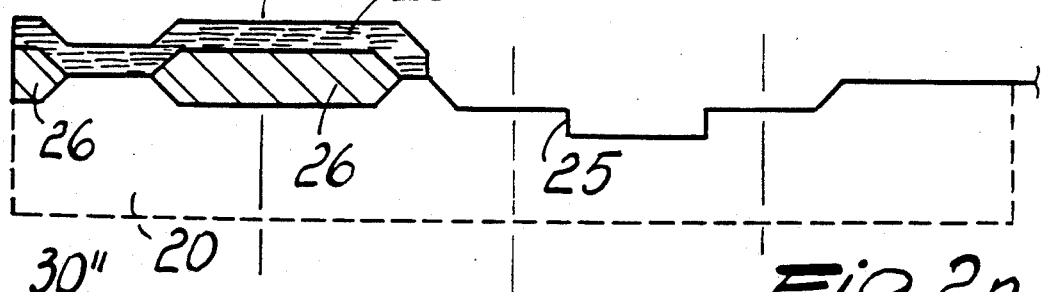
Figure 2O:
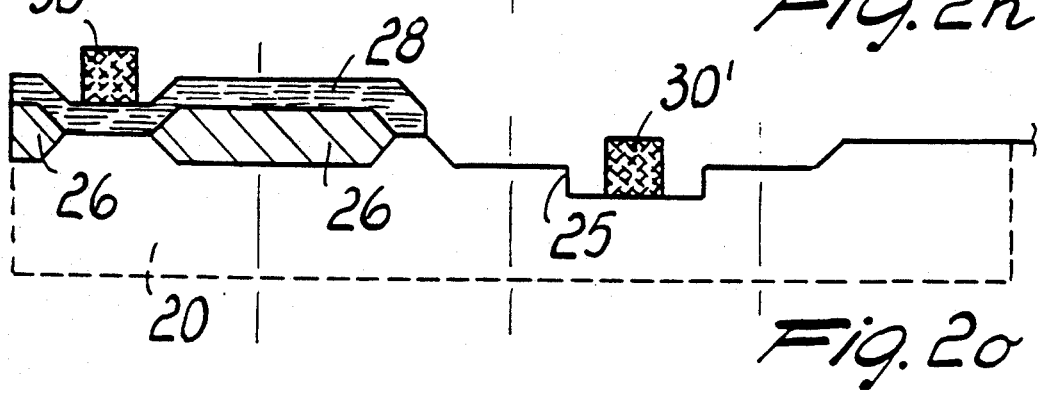

In order to evaluate the sensitivity of the machine or of the measurement instruments in the case of grown layers, as occurs for example in the case of polysilicon on an active area, it is possible to resort to the following second embodiment of the process according to the invention, which comprises the following steps, performed sequentially on a substrate 20:

an initial step, FIG. 2a, during which a first layer 21 of silicon nitride is deposited on the substrate 1;

a first deposition step, FIGS. 2b and 2c, during which a layer 22 of photoresist is deposited on the first layer 21 and is then masked and developed in order to delimit regions A of the substrate 20 and regions B of the first layer 21;

a first etching step, FIG. 2d, during which the first layer 21 is etched, uncovering regions A of the substrate 20, and the photoresist layer 22 is subsequently removed;

a second deposition step, FIG. 2e, during which a layer 23 of photoresist is deposited on the regions A of the substrate 20 and on the regions B of nitride 21 and is subsequently masked and developed, delimiting insulated regions of the substrate 20 and of the first layer 21;

a second etching step, FIG. 2f, during which the substrate 20 is etched, creating wells 25 in said substrate and partially etching the first layer 21;

a third deposition step, FIG. 2g, during which a layer 24 of photoresist is deposited on the regions A of the substrate 20 and on the regions B of the first layer 21 and is subsequently masked and developed in order to delimit insulated regions of the first layer 21;

a third etching step, FIG. 2h, during which the uncovered insulated regions of the first layer 21 are etched and the remaining portions of the photoresist layers 23 and 24 are subsequently removed;

a growth step, FIG. 2i, during which a second layer 26 of field oxide is grown; as is known, said field oxide grows in the portions of the substrate 20 which are not covered by the first nitride layer 21;

a fourth etching step, FIG. 2j, during which the first layer 21 is etched completely, removing the remaining portions thereof;

a fourth deposition step, FIG. 2k, during which a photoresist layer 27 is deposited and is subsequently masked and developed, uncovering insulated regions of the second layer 26;

a fifth etching step, FIG. 2l, during which the second layer 26 is etched, uncovering the wells 25 previously defined in the substrate 20, and the remainder of the photoresist layer 27 is then removed;

a fifth deposition step, FIG. 2m, during which a third layer 28 of polysilicon is deposited;

a sixth deposition step, FIGS. 2m and 2n, during which a photoresist layer 29 is deposited on the third layer 28 and is subsequently masked and developed in order to delimit the regions A of the substrate 20;

a sixth etching step, FIG. 2n, during which the third layer 28 is etched, uncovering the regions A of the substrate 20, and the remaining part of the photoresist layer 29 is subsequently removed;

a final step, FIG. 2o, during which a photoresist layer 30 is deposited and is subsequently masked and developed, delimiting photoresist insulated regions 30, and 30'' arranged respectively within the wells 25 of the substrate 20 and on the third layer 28 between portions of the second layer 26 which are arranged below said third layer, as more clearly illustrated in FIG. 2o.

The substrates 1 and 20 can include silicon wafers.

The different embodiments of the process described above allow the definition of, simultaneously and on a single substrate, two different types of areas: a first type (represented by region A) which has profiles of the box-within-a-box type on the silicon substrate, and a second type (represented by region B) which has profiles which are defined on layers obtained with an industrial production process and have the same statistical distribution, since they are performed simultaneously, on the same substrate and with a positional configuration which is complementary to the box-Within-a-box profiles. That is, the process of the invention produces metrological structures that have measurement profiles defined on substrate regions and on industrially-processed regions on a single wafer. The measurement profiles define statistical distributions which can be detected by measurement machines in order to analyze the measurement accuracy of the machines themselves.

The different regions A and B can be distributed on the silicon wafer in different manners; for example by alternating them in the same exposure field, produced with machines usually termed "steppers", or by alternating exposure fields with the two different structures. Exposure machines, that is to say steppers, in fact allow the provision of, on the same wafer, a plurality of adjacent non-overlapping exposures in successive time frames, so as to cover the entire surface of said wafer.

Statistical comparison between the two types of areas thus obtained with the above described processes allows the evaluation of the degree of precision and accuracy of the machine or measurement instrument on the industrially processed region considered with respect to the substrate regions.

In practice, the profiles defined on silicon are measured first, followed by those defined on the industrially processed regions. Measurement error can thus be evaluated with statistical methods, for example by calculating the quadratic difference of the dispersions and the difference of the mean values.

However, the measurements of repeatability and TIS, as more clearly explained hereinafter, which are commonly used, provide information on the characteristics of the measurement instrument but provide no direct measurement of the error or the sensitivity of the instrument itself.

TIS is a parameter defined as half the difference (in absolute value) between the measurement of a pattern and the same measurement performed by rotating the wafer through 180 degrees.

The present invention allows the evaluation of the error made by the measurement instrument, that is to say the sensitivity of said instrument, in real working conditions, not in artificially prepared situations as was the case until the advent of the present invention.

Practical tests have shown that the invention achieves the intended aim and objects, providing a process for producing metrological structures which is capable of completely characterizing, from the point of view of sensitivity, a measurement instrument or machine which can be used in a productive environment.

These metrological structures furthermore advantageously allow the measurement of the typical error of the measurement machine with respect to a preset reference during different production steps, allowing possible recycling and reprocessing of the wafers whose defectiveness is greater than normal.

The structure thus described is susceptible of numerous modifications and variations, all of which are within the scope of the inventive concept. All the details may furthermore be replaced with other technically equivalent elements.

In practice, the materials employed, as well as the dimensions, may be any according to the requirements.

We claim:

1. A process for producing metrological structures on a single substrate for analyzing an accuracy of an instrument used to measure alignment of structures on a processed substrate, comprising the steps of:

defining first and second regions on the single substrate;

defining, in the first region, at least one well in the substrate;

disposing, in the at least one well in the first region, an insulated portion comprising a radiation-sensitive material; and disposing, in the second region, a first layer of a first material on the substrate, a second layer of a second material on the first layer of the first material, and an insulated portion including a third layer of a radiation-sensitive material on predetermined portions of the second layer of the second material.

2. The process of claim 1, wherein the steps of disposing a radiation-sensitive material in the first region and disposing a radiation-sensitive material in the second region comprise disposing the radiation-sensitive material in the first and second regions in a statistical distribution suitable for measurement and comparison to each other.

3. The process of claim 2, further comprising the steps of defining a plurality of first and second regions on the substrate and arranging the first and second regions in an alternating pattern on the substrate.

4. A process for producing methological structures on a single substrate for analyzing an accuracy of an instrument used to measure alignment of structures on a processed substrate, comprising the steps of:

depositing a first layer of a first material on the single substrate;

defining first and second regions of the substrate by depositing a first layer of radiation-sensitive material on the first layer and masking and developing the first layer of radiation-sensitive material;

etching the first and second regions of the substrate to expose the substrate and to remove the first layer of radiation-sensitive material so that the first region comprises only the substrate and the second region comprises the first material and the substrate;

depositing a second layer of radiation-sensitive material on the first and second regions and masking and developing the second layer of radiation-sensitive material to define predetermined insulated regions of the first layer of the first material in the second region and predetermined insulated regions of the substrate in the first region;

etching the predetermined insulated regions to define wells in the substrate in the first region and to partially etch the predetermined insulated regions of the first layer of the first material in the second region;

depositing a third layer of radiation-sensitive material on the predetermined insulated regions and masking and developing the third layer of radiation-sensitive material to expose the predetermined insulated regions of the first layer of the first material in the second region;

etching the predetermined insulated regions of the first layer of the first material in the second region to define wells in the first layer of the first material;

depositing a second layer of a second material on the first and second regions;

depositing a fourth layer of radiation-sensitive material on the second layer of the second material and masking and developing the fourth layer of radiation-sensitive material to expose the second layer of the second material in the first region;

etching the first and second regions to expose the substrate and to remove the fourth layer of radiation-sensitive material so that the first region comprises only the substrate and the second region comprises the second material, the first material, and the substrate; and depositing a fifth layer of radiation-sensitive material on the second layer of the second material and the substrate and masking and developing the fifth layer of radiation-sensitive material to expose predetermined portions of the second layer of the second material in the second region and to provide insulated portions of radiation-sensitive material in the wells in the substrate in the first region.

5. The process of claim 4, wherein the step of depositing, masking, and developing the fifth layer of radiation-sensitive material includes masking and developing the fifth layer of radiation-sensitive material so that the layer of radiation-sensitive material in the first and second regions has a statistical distribution suitable for measurement and comparison to each other.

6. The process of claim 5, further comprising the steps of defining a plurality of first and second regions on the substrate and arranging the first and second regions in an alternating pattern on the substrate.

7. The process of claim 5, wherein the step of depositing the first layer of the first material comprises depositing polysilicon.

8. The process of claim 5, wherein the step of depositing the first layer of the first material comprises depositing a contact dielectric.

9. The process of claim 5, wherein the step of depositing the first layer of the first material comprises depositing a first metalization.

10. The process of claim 5, wherein the step of depositing the first layer of the first material comprises forming vias.

11. The process of claim 5, wherein the step of depositing the second layer of the second material comprises forming a layer of contacts.

12. The process of claim 5, wherein the step of depositing the second layer of the second material comprises depositing a first metalization.

13. The process of claim 5, wherein the step of depositing the second layer of the second material comprises depositing a second metalization.

14. The process of claim 5, wherein the step of depositing the second layer of the second material comprises forming vias.

15. The process of claim 5, further comprising the step of carrying out the process using a substrate comprising a silicon wafer.

16. A process for producing metrological structures on a single substrate for analyzing an accuracy of an instrument used to measure alignment of structures on a processed substrate, comprising the steps of:

depositing a first layer of a first material on the single substrate;

defining first and second regions of the substrate by depositing a first layer of radiation-sensitive material on the first layer and masking and developing the first layer of radiation-sensitive material;

etching the first and second regions of the substrate to expose the substrate and to remove the first layer of radiation-sensitive material so that the first region comprises only the substrate and the second region comprises the first material and the substrate;

depositing a second layer of radiation-sensitive material on the first and second regions and masking and developing the second layer of radiation-sensitive material to define predetermined insulated regions of the first layer of the first material in the second region and predetermined insulated regions of the substrate in the first region;

etching the substrate to define wells in the substrate in the first region and to partially etch the predetermined insulated regions of the first layer of the first material in the second region;

depositing a third layer of radiation-sensitive material on the first and second regions to cover the wells in the first region and the first layer of the first material in the second region;

etching the third layer of radiation-sensitive material in the first and second regions the second region to expose the substrate and to remove the third layer of radiation-sensitive material so that the first region comprises only the substrate and the second region comprises portions including the substrate and the first material and portions including the substrate only;

growing a second layer of a second material on the substrate in the first and second regions;

etching the first and second regions to remove the first material;

depositing a fourth layer of radiation-sensitive material on the first and second regions and masking and developing the fourth layer of radiation-sensitive material to expose predetermined portions of the second layer in the first and second regions;

etching the first and second regions of the substrate to expose the wells in the substrate in the first region and to remove the fourth layer of radiation-sensitive material so that the first region comprises only the substrate and the second region comprises portions including the substrate and the first material and portions including the substrate only;

depositing a third layer of a third material covering the first and second regions;

depositing a fifth layer of radiation-sensitive material covering the third layer of the third material and masking and developing the fifth layer of radiation-sensitive material;

etching the first and second regions of the substrate to expose the wells in the substrate in the first region and to remove the fifth layer of radiation-sensitive material so that the first region comprises only the substrate and the second region comprises portions including the substrate, the first material, and the second material and portions including the substrate only; and depositing a fifth layer of radiation-sensitive material on the second layer of the second material and the substrate and masking and developing the fifth layer of radiation-sensitive material to expose predetermined portions of the second layer of the second material in the second region and to provide insulated portions of radiation-sensitive material in the wells in the substrate in the first region.

17. The process of claim 16, wherein the step of depositing, masking and developing the fifth layer of radiation-sensitive material includes masking and developing the fifth layer of radiation-sensitive material so that the layer of radiation sensitive material in the first and second regions has a statistical distribution suitable for measurement and comparison to each other 18. The process of claim 17, further comprising the steps of defining a plurality of first and second regions on the substrate and arranging the first and second regions in an alternating pattern on the substrate.

19. The process of claim 17, wherein the step of depositing the first layer of the first material comprises depositing silicon nitride.

20. The process of claim 17, wherein the step of growing the second layer of the second material comprises growing a field oxide.

21. The process of claim 17, wherein the step of depositing the third layer of the third material comprises depositing polysilicon.

22. An apparatus for use in analyzing an accuracy of an instrument used to measure alignment of structures on a processed substrate, comprising:

a single substrate having first and second regions defined thereon;

the second region having at least one well in the substrate including an insulated portion comprising a radiation-sensitive material disposed therein;

the second region having a first layer of a first material on the substrate, a second layer of a second material on the first layer of the first material, and an insulated portion including a third layer of radiation-sensitive material on predetermined portions of the second layer of the second material; and the radiation-sensitive material in the first region and the radiation-sensitive material in the second region being disposed in a statistical distribution suitable for measurement and comparison to each other.

23. The apparatus of claim 22, further comprising a plurality of first and second regions on the substrate and arranging the first and second regions in an alternating pattern on the substrate.

* * * * *